(12) United States Patent
Bose et al.

(10) Patent No.: US 10,696,430 B2
(45) Date of Patent: Jun. 30, 2020

(54) MODULAR SATELLITE

(71) Applicant: Airbus DS GmbH, Taufkirchen (DE)

(72) Inventors: Guido Bose, Immenstaad (DE);
Andreas Grasl, Rohrdorf/Thansau (DE)

(73) Assignee: AIRBUS DS GMBH, Taufkirchen (DE)

( * ) Notice: Subject to any disclaimer, the term of this patent is extended or adjusted under 35 U.S.C. 154(b) by 336 days.

(21) Appl. No.: 15/158,097

(22) Filed: May 18, 2016

(65) Prior Publication Data
US 2016/0340061 A1    Nov. 24, 2016

(30) Foreign Application Priority Data

May 19, 2015   (EP) .................................. 15001501

(51) Int. Cl.
| | |
|---|---|
| *B64G 1/10* | (2006.01) |
| *B64G 1/50* | (2006.01) |
| *H05K 7/20* | (2006.01) |
| *B64G 1/44* | (2006.01) |

(52) U.S. Cl.
CPC .............. *B64G 1/506* (2013.01); *B64G 1/10* (2013.01); *B64G 1/50* (2013.01); *H05K 7/20* (2013.01); *H05K 7/20254* (2013.01); *B64G 1/44* (2013.01); *B64G 2001/1092* (2013.01)

(58) Field of Classification Search
CPC .. B64G 1/506; B64G 1/10; B64G 2001/1092; H05K 7/20
See application file for complete search history.

(56) References Cited

U.S. PATENT DOCUMENTS

| | | | | |
|---|---|---|---|---|
| 5,050,821 | A | * 9/1991 | Kerstein .................. | B64G 1/14 244/158.1 |
| 5,271,582 | A | * 12/1993 | Perkins .................... | B64G 1/22 244/159.4 |
| 5,314,146 | A | * 5/1994 | Chicoine .................. | B64G 1/10 244/159.4 |

(Continued)

FOREIGN PATENT DOCUMENTS

| | | |
|---|---|---|
| DE | 102005044712 | 4/2007 |
| EP | 0780295 | 6/1997 |

(Continued)

OTHER PUBLICATIONS

European Search Report, dated Nov. 3, 2015, priority document.

*Primary Examiner* — Brian M O'Hara
*Assistant Examiner* — Keith L Dixon
(74) *Attorney, Agent, or Firm* — Greer, Burns & Crain, Ltd.

(57) ABSTRACT

A modular satellite having a plurality of electronics boxes that accommodate electrical and/or electronic modules. The electronics boxes are or can be electrically connected with one another. The satellite is provided with a basis structural panel, a docking structure disposed on the basis structural panel, and a plurality of device carrier panels that are or can be connected with the docking structure. The docking structure has first electrical connection elements for an electrical connection with the electronics boxes. The device carrier panels have mechanical connection elements for holding the electronics boxes. The respective device carrier panel is configured, at least in certain regions, so that it can be tempered by means of integrated heat sources and/or heat sinks.

19 Claims, 7 Drawing Sheets

(56) References Cited

U.S. PATENT DOCUMENTS

| | | | | |
|---|---|---|---|---|
| 5,755,406 A | * | 5/1998 | Aston | B64G 1/1007 244/159.4 |
| 5,839,696 A | | 11/1998 | Caplin et al. | |
| 6,206,327 B1 | * | 3/2001 | Benedetti | B64G 1/10 244/159.4 |
| 7,513,462 B1 | * | 4/2009 | McKinnon | B64G 1/1007 244/173.1 |
| 8,146,867 B2 | * | 4/2012 | Jordan | B64G 1/10 244/159.4 |
| 8,820,684 B2 | * | 9/2014 | McKinnon | B64G 1/50 244/171.8 |
| 8,910,701 B2 | * | 12/2014 | Torres Sep Iveda | B64G 1/50 165/103 |
| 9,708,080 B2 | * | 7/2017 | Judd | B64G 1/10 |
| 2006/0076458 A1 | | 4/2006 | Russell | |
| 2006/0185277 A1 | * | 8/2006 | Quincieu | B64G 1/10 52/265 |
| 2010/0008053 A1 | | 1/2010 | Osternack et al. | |
| 2014/0039729 A1 | * | 2/2014 | Puig-Suari | B64G 1/66 701/3 |

FOREIGN PATENT DOCUMENTS

| | | |
|---|---|---|
| EP | 1004507 | 5/2000 |
| WO | 2005080198 | 9/2005 |

\* cited by examiner

Fig. 6

MODULAR SATELLITE

CROSS-REFERENCES TO RELATED APPLICATIONS

This application claims the benefit of the European patent application No. 15001501.4 filed on May 19, 2015, the entire disclosures of which are incorporated herein by way of reference.

BACKGROUND OF THE INVENTION

The present invention relates to a modular satellite having a plurality of electronics boxes that accommodate electrical and/or electronic modules.

In general, satellites are produced in single-unit production, produced and tested individually in a manufacturing operation, in numbers of only few units. Aside from the mechanical satellite structure and the drive and control components required for position control, as well as the power supply components, a satellite mainly consists of a payload that is generally formed by electrical and/or electronic components. This payload is usually accommodated in housings, called electronics boxes or electronics cases. For this reason, in space flight, individual electrical connections, mechanical connections, and frequently also heat transfer connections have to be produced manually for integration of each electronics box with the satellite, and always have to be tested, and this leads to great production effort at the integration workplace. This integration workplace is therefore occupied for this long period of time that the integration activity takes up.

An avionics device carrier system having a quick-installation housing for aircraft is known from DE 10 2005 044 712 A1. This system has a housing having insert frames for accommodation of insert modules. It is configured for installation in an avionics module frame provided in the cockpit, and forms a quick-installation housing there.

SUMMARY OF THE INVENTION

It is the task of the present invention to indicate a modular satellite that can be quickly integrated in the phase of final production.

This modular satellite has a plurality of electronics boxes that accommodate electrical and/or electronic modules, which boxes are electrically connected or electrically connectable with one another, and comprises a basis structural panel, a docking structure disposed on the basis structural panel, a plurality of device carrier panels that are connected or connectable with the docking structure. The docking structure in turn has first electrical connection elements for an electrical connection with the electronics boxes, and the device carrier panels have mechanical connection elements for holding the electronics boxes. The respective device carrier panel is configured, at least in certain regions, so as to be temperable by means of integrated heat sources and/or heat sinks.

The modular construction of the satellite, according to the invention, makes it possible to pre-manufacture and test individual components, such as, for example, the electronics boxes, at a different location, so that at the integration location of the satellite, they only have to be tested for inter-functionality with the device carrier panel and the docking structure and to be connected, because they can be delivered as components that have already been tested, for example, by means of the built-in testing device, also with regard to the interfaces. The individual device carrier panels can also be pre-manufactured, so that during integration of the satellite, they can be integrated as pre-manufactured components that have been tested for functionality. As a result, not only is the integration time of the satellite clearly reduced, but also the capacity of existing integration workplaces is significantly increased.

In this way, the prerequisites for efficient production of a larger number of satellites are created.

In an advantageous further development of the invention, the mechanical connection elements of the device carrier panels and the electrical connection elements of the docking structure assigned to them form docking stations for the electronics boxes, wherein at least part of the docking stations are configured in the same manner and arranged in a raster to determine accommodation niches for the electronics boxes. Such a docking structure having docking stations configured in the same manner makes it possible to insert electronics configured in likewise "standardized" manner into any desired accommodation niche that forms a docking station of the docking structure. In this way, a compact satellite, formed in the manner of a rack, is created.

Preferably, the docking structure is configured as a lattice-like box profile, in the interior of which electrical supply lines and connection lines run, which lines are connected, in electrically conductive manner, with the electrical connection elements. A thermal infrastructure to supply heat sources or heat sinks provided in the device carrier panels can also be accommodated within the box-like profile of the docking structure.

It is advantageous if the heat sources and/or heat sinks integrated into the device carrier panel are provided in a base plate of the device carrier panel. In this way, the room on the base plate is completely available for accommodating and supporting a related electronics box, and the contact surface between the electronics box and the base plate, which is required for heat transfer, is maximized.

In this regard, it is advantageous if the base plate is provided with at least one heat contact surface in the region of the first mechanical connection elements, on which surface an electronics box that stands in engagement with the mechanical connection elements lies on a housing surface with heat-conductive contact, and if thereby the at least one heat contact surface stands in heat-conductive contact with the heat source and/or heat sink integrated into the base plate.

In an embodiment, the base plate is equipped, at least in certain regions, with heat conduction devices, which are configured for transporting away, by means of heat conduction, the heat or cold that acts on the base plate or on a region of the base plate.

Preferably, the heat conduction devices have heat pipes that are provided on or in the base plate. In this regard, the heat pipes are preferably formed by tracks of heat-conductive material, preferably of a metal, that run in the interior of the base plate.

Alternatively, the heat pipes can be formed by channels of a heat-conductive material, preferably of a metal, that run in the interior of the base plate, through which channels a heat transport medium flows or can flow.

It is particularly advantageous if the base plate is provided with heat conduction coupling devices, which stand in a heat-conductive connection with the heat conduction devices, and are couplable, in heat-conductive manner, with other heat conduction devices outside of the base plate. This allows rapid integration of a device carrier panel that has such a thermal base plate, into the thermal infrastructure provided in the docking structure.

In addition, or alternatively to the heat conduction devices, the base plate is equipped, at least in certain regions, with electrical cooling and/or heating devices that are configured for directly cooling or heating the base plate or a region of the base plate.

It is particularly advantageous if a plurality of individually controllable heat conduction devices and/or cooling and/or heating devices is provided, distributed over the surface of the base plate. This embodiment makes it possible to achieve cooling and/or heating of the base plate and thereby of the electronics box that lies on the base plate, which is appropriate for local needs.

In this regard, it is advantageous if at least one temperature sensor is assigned to each individually controllable heat conduction device and/or cooling and/or heating device, in or on the base plate, thereby making precise local temperature control or temperature regulation possible.

In an advantageous further development of the invention, a temperature control device is provided, which is connected with the temperature sensors by way of signal lines and is connected with the individually controllable heat conduction devices and/or cooling and/or heating devices by way of control lines.

In this regard, it is particularly advantageous if the temperature control device is provided on the base plate or integrated into the base plate.

The dimensions as well as the geometrical shape of the electronics boxes can be configured as desired, both with regard to size and also with regard to shape. The dimensions merely have to correspond to maximal dimensions that have been predetermined, so that the installation space, the layout dimensions (length and width), as well as the shape and placement of the electrical and mechanical connection elements is defined. In this way, compatibility between the mechanical and the electrical connection elements is ensured.

Preferred exemplary embodiments of the invention, with additional embodiment details and further advantages, will be described and explained in greater detail below, making reference to the attached drawings.

DETAILED DESCRIPTION OF THE PREFERRED EMBODIMENTS

Figure 1:
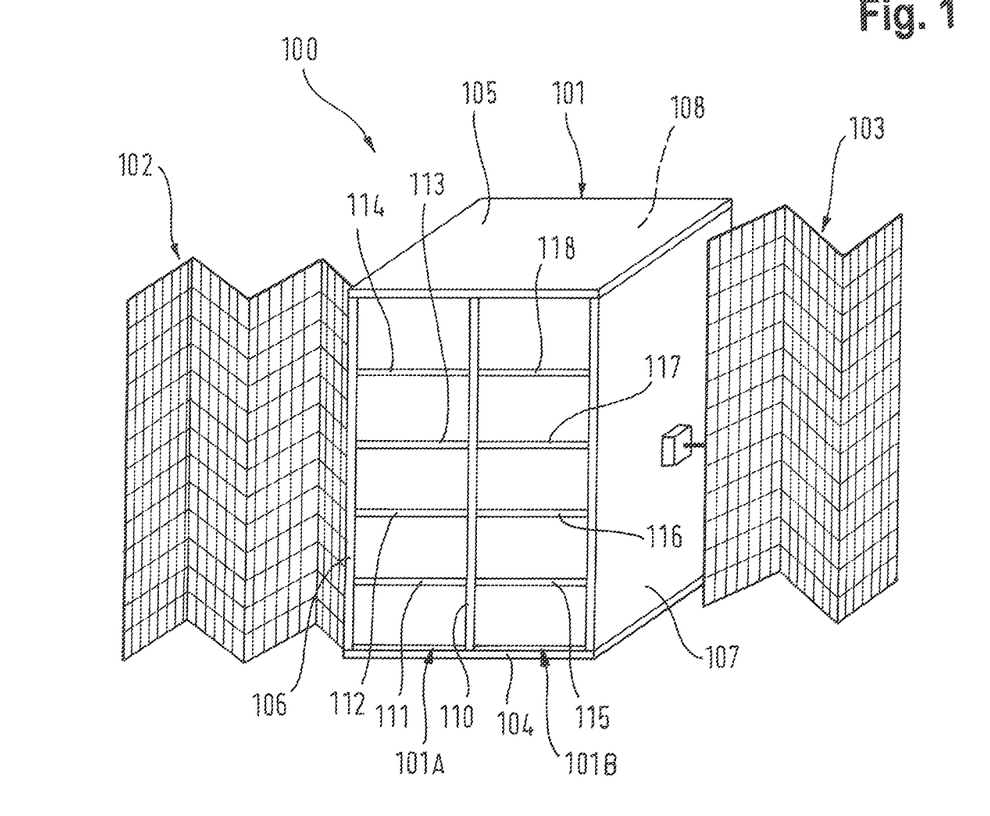
FIG. 1 is a schematic, perspective representation of a modular satellite according to the invention.

In FIG. 1, a modular satellite 100 according to a first exemplary embodiment of the invention is shown schematically. The satellite 100 comprises a corpus 101, to which an unfoldable solar panel 102, 103 is attached on two sides that face away from one another, in each instance.

Figure 2:
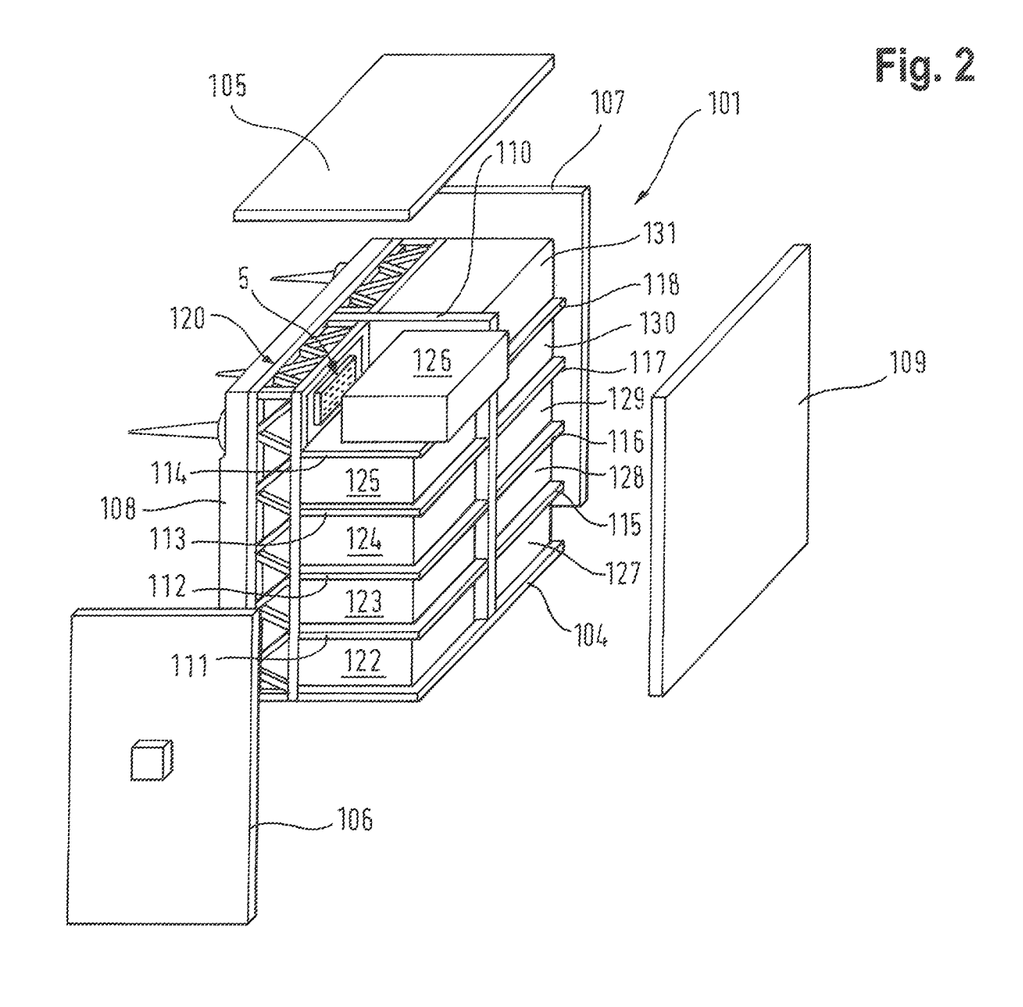
FIG. 2 is a perspective, exploded view of the satellite from FIG. 1.

The corpus 101 possesses a block-shaped form with a lower floor wall panel 104, an upper ceiling wall panel 105, a first side wall panel 106, and a second side wall panel 107. The rear wall of the block-shaped corpus 101, which is not visible in FIG. 1 but is shown in FIG. 2, is formed by a basis structural panel 108. A front wall panel 109 (FIG. 2) is not shown in FIG. 1.

By leaving out the front wall panel 109 in FIG. 1, the register-like inner structure of the corpus 101 can be seen. A center vertical partition wall panel 110, which runs parallel to the side wall panels 106, 107, divides the interior of the corpus 101 into two interior regions 101A, 101B of equal width. Each of these two interior regions is divided into five accommodation spaces of equal height, for one electronics box each, by means of four device carrier panels 111,112, 113, 114 and 115, 116, 117, 118, respectively, which run at a right angle to the vertical partition wall panel 110 and parallel to the floor panel 104 and to the ceiling panel 105.

In FIG. 2, it can be seen that the basis structural panel 108 is provided, on its surface that faces toward the inside of the corpus 101, with a docking structure 2 configured as a lattice-like box profile, which structure will be explained in greater detail below. The docking structure 2 is provided with electrical connection elements 5 on its side facing away from the basis structural panel 108.

An electronics box 122, 123, 124, 125, 126 or 127, 128, 129, 130, 131, respectively, is inserted into each of the accommodation compartments, in the example of FIG. 2. In the example of FIG. 2, it can be recognized that the uppermost left electronics box 126 is not completely inserted, so that the electrical connection elements 5 of the docking structure 2 assigned to this accommodation compartment are visible.

Figure 3:
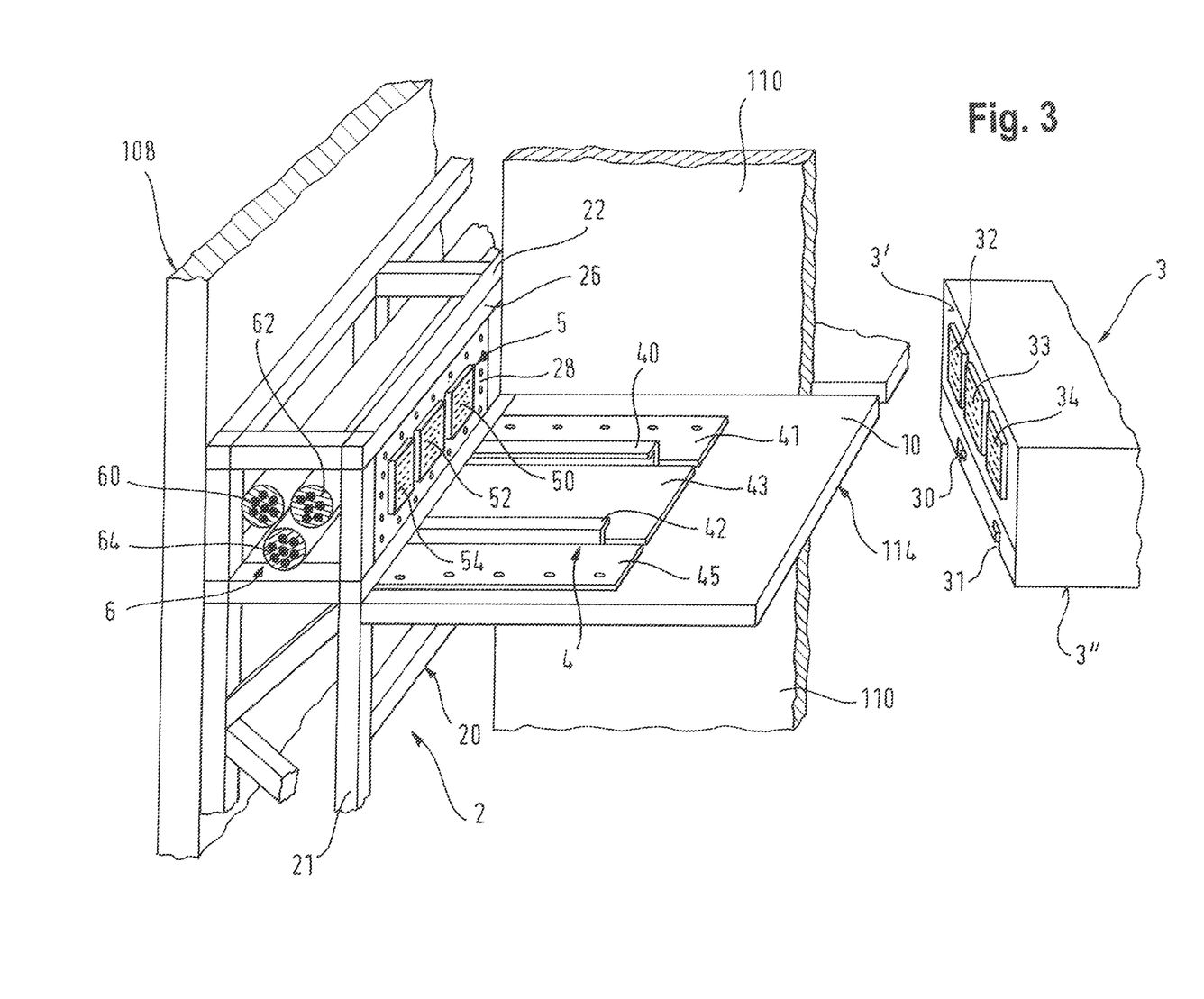
FIG. 3 is a perspective view of a detail of a device carrier panel with docking structure and an electronics box.

FIG. 3 shows, in an enlarged representation, an accommodation compartment with the device carrier panel 114. The device carrier panel 114 is firmly connected with the docking structure 2. The further accommodation compartments of the corpus 101 are structured in the same manner, so that they will not be described, in order to avoid repetition. For the two lowermost accommodation compartments of the corpus 101, the floor plate 104 is also configured as a device carrier panel, as will be described below.

The docking structure 2 comprises a box-like lattice framework 20, which is formed from a light material, such as, for example, a carbon fiber composite (Carbon Fiber Reinforced Polymer) or a light metal (e.g., aluminum). The docking structure 2 has four outer sides, which are oriented essentially at a right angle to the expanse surface of the basis structural panel 108, and of which only the left side 21 and the top side 22 are shown in FIG. 3. The front side 26 of the docking structure 2, which faces away from the basis structural panel 108, runs essentially parallel to the surface of the basis structural panel 108.

Electrical supply lines and connection lines 6 run in the interior of the docking structure 2; in the example shown, they comprise three cable harnesses 60, 62, 64.

The lattice framework 20 can be provided with cover plates 28, which close off or cover regions of the lattice framework 20. In the example shown, only one cover plate 28 is represented at the top side 26 of the accommodation compartment shown; the other accommodation compartments are also covered toward the docking structure 2 by means of such a cover plate. Such cover plates can also be affixed to the outer sides of the lattice framework 20.

The cover plate 28 is provided with three electrical plug-in connectors 50, 52, 54, which together form first electrical connection elements 5 of the docking structure 2. These plug-in connectors 50, 52, 54 are electrically connected with electrical supply lines and connection lines that run in the interior of the docking structure 2.

The device carrier panel 114 is connected, in a mechanically firm manner, with the basis structural panel 108 and/or with the lattice framework 20 of the docking structure 2, underneath the cover plate 28. The device carrier panel 114 has a base plate 10. Two rails 40, 42, laterally spaced apart from one another, are affixed to the base plate 10 of the device carrier panel 114, at a right angle to the expanse of the cover plate 28, in front of the section of the docking structure 2 provided with the cover plate 28; these rails determine mechanical connection elements 4. Plate-like heat contact surfaces 41, 43, 45 are affixed to the base plate 10 between the two rails 40, 42 and laterally next to these rails, in each instance, which surfaces stand in heat-conductive contact with the base plate 10, as will be described below.

In FIG. 3, an electronics box 3 is furthermore shown, which corresponds to the electronics box 126 in FIG. 2 and accommodates electronic modules (for example devices and/or electronic circuit arrangements). On the face side 3' of the electronics box 3, which can be seen in the perspective view of FIG. 3, facing the cover plate 28 of the docking structure 2, three electrical plug-in connectors 32, 33, 34 are provided, which each form an electrical counter-connection elements for the corresponding plug-in connector 50, 52, 54 of the cover plate 28 that lies opposite them. In the lower region of the face side 3' of the electronics box 3, mechanical counter-connection elements 30, 31 are provided, which are configured as grooves, which correspond, in terms of cross-section, to the cross-section of the rails 40, 42 and extend along the underside of the electronics box 3.

The electronics box 3 can be pushed onto the rails 40, 42, in this manner, in that these rails 40, 42 are introduced into a groove assigned to them (mechanical counter-connection elements 30, 31), in each instance. The electronics box 3 can then be pushed along the rails 40, 42, in the direction toward the cover plate 28 of the docking structure 2, in the manner of a drawer, until the electrical plug-in connectors 50, 52, 54 of the first electrical connection elements 5 enter into engagement with the corresponding electrical counter-connection elements 32, 33, 34 on the face side 3' of the electronics box 3 and produce electrical connections between the electronics box 3 and the docking structure 2. In this electrically contacting position, the electronics box 3 is fixed in place on the docking structure 2 and/or on the base plate 10 by way of a locking arrangement (not shown). In this regard, the electronics box 3 lies on the thermal contact plates 41, 43, 45 with its underside 3" and produces a planar, thermally conductive connection there.

The device carrier panel 114 (like the other device carrier panels, as well) is configured as a thermal transfer panel that can be tempered, and for this purpose is provided, at least in certain regions, with integrated heat sources and/or heat sinks.

Figure 4:
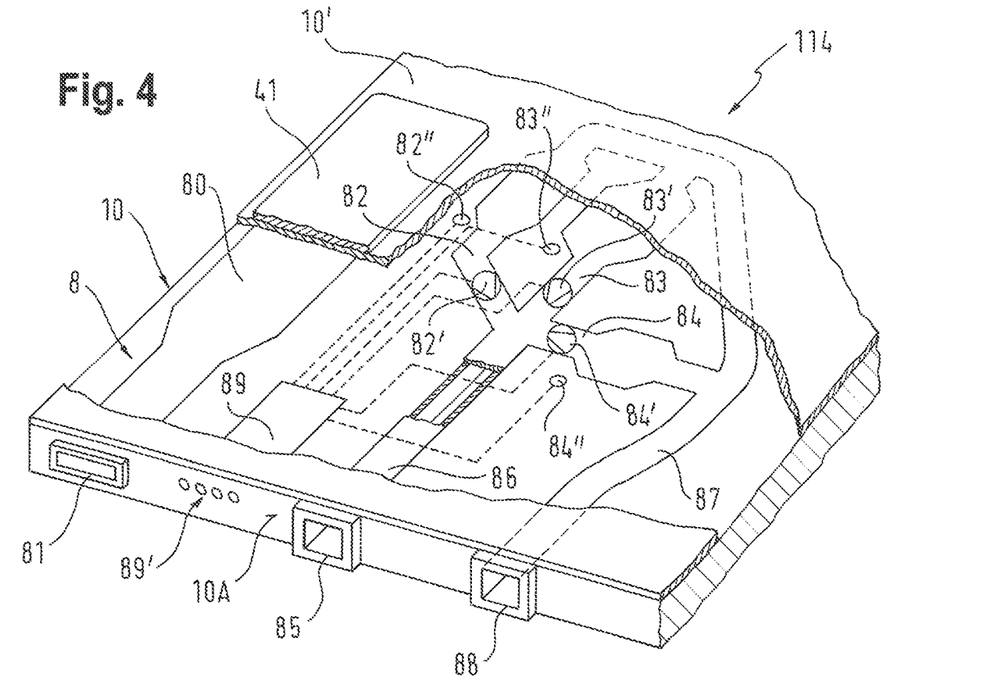
FIG. 4 is a perspective view of a base plate of a device carrier panel according to the invention, with heat conduction devices.

FIG. 4 shows, in a perspective view, the partially cut-open device carrier panel 114 in a first embodiment. Heat conduction devices 8 are integrated into the base plate 10 of the device carrier panel 114. The heat conduction devices 8 are represented in two different variants in the example shown in FIG. 4.

A first variant of the heat conduction devices has a heat conduction layer 80 that is composed of a material with good heat conductivity, for example a metal such as copper or aluminum, provided in the interior of the base plate 10, and forms a passive heat conduction device. On its top side, the base plate 10 is provided with a cover layer 10' that has good heat conductivity and stands in a direct heat-conducting connection with the heat conduction layer 80. In addition, a thermal contact plate 41 is disposed locally above the heat conduction layer 80, which plate stands in a heat-conductive connection with the heat conduction layer 80, either directly or indirectly by way of the cover layer 10'. The related electronics box is placed on the thermal contact plate 41, so that the heat produced in it is conducted away into the heat conduction layer 80 by means of the thermal contact plate 41.

The heat conduction layer 80 leads to a first heat conduction coupling device 81 in a face side 10A of the base plate 10, by way of which device a heat conduction connection to the basis structural panel 108 or to a heat conduction channel of the satellite infrastructure, not shown in any detail, can be produced during installation of the device carrier panel 114 into the satellite infrastructure. In this manner, the heat introduced from the electronics box 126 disposed on the device carrier panel 114 into the base plate 10 can be conducted away to heat sinks connected with the heat conduction channel Such a heat sink can be, for example, the basis structural panel 108, which is situated on the shade side of the satellite.

In FIG. 4, a second variant of the heat conduction devices 8 is shown, which variant works actively. For this purpose, a system of channels 82, 83, 84 composed of a material that conducts heat well, for example a metal, such as copper or aluminum, for example, is provided in the interior of the base plate. The channels 82, 83, 84, which can vary in their width dimension, as can be seen in FIG. 4, are hollow, and a heat transport fluid flows through them. A second heat conduction coupling device 85 is provided in the face side 10A of the base plate 10, and an inflow channel 86 runs from there, in the interior of the base plate 10, to the channels 82, 83, 84. Controllable valves 82', 83', 84' are disposed in the related channel 82, 83, 84, in each instance, in order to control the flow of heat transport fluid through them. The channels 82, 83, 84 flow into a common return channel 87 behind the valves 82', 83', 84', which channels runs to a third heat conduction coupling device 88 provided in the face side 10A of the base plate 10. Even though this is not explicitly shown in FIG. 4, at least one thermal contact plate 41 can be provided in this variant, as well, in the same manner as described in connection with the first variant.

A temperature sensor 82", 83", 84" is assigned to the respective channel 82, 83, 84. The temperature sensors 82", 83", 84" and also the controllable valves 82', 83', 84' stand in an electrically conductive connection with a temperature control device 89 by way of signal lines shown with broken lines. The temperature control device 89 is represented as a component integrated into the interior of the base plate 10, in the example shown, but it can also be provided in a different way on the side or on the top of the base plate 10, and is an integral part of the device carrier panel 114 that has the base plate 10, in any case. Electrical contact lines 89' are provided in the face side 10A of the base plate 10 and serve to produce electrical connections to a power supply unit and to a central monitoring device of the satellite.

Although two different variants of the heat conduction devices 8 are represented in FIG. 4, it is clear to a person skilled in the art that he/she can also provide exclusively the first, passive variant or exclusively the second, active variant in a base plate 10. Of course, however, it is also possible to provide the two variants in any desired manner, independently, next to one another (as shown in FIG. 4) or combined with one another in a base plate.

Figure 5:
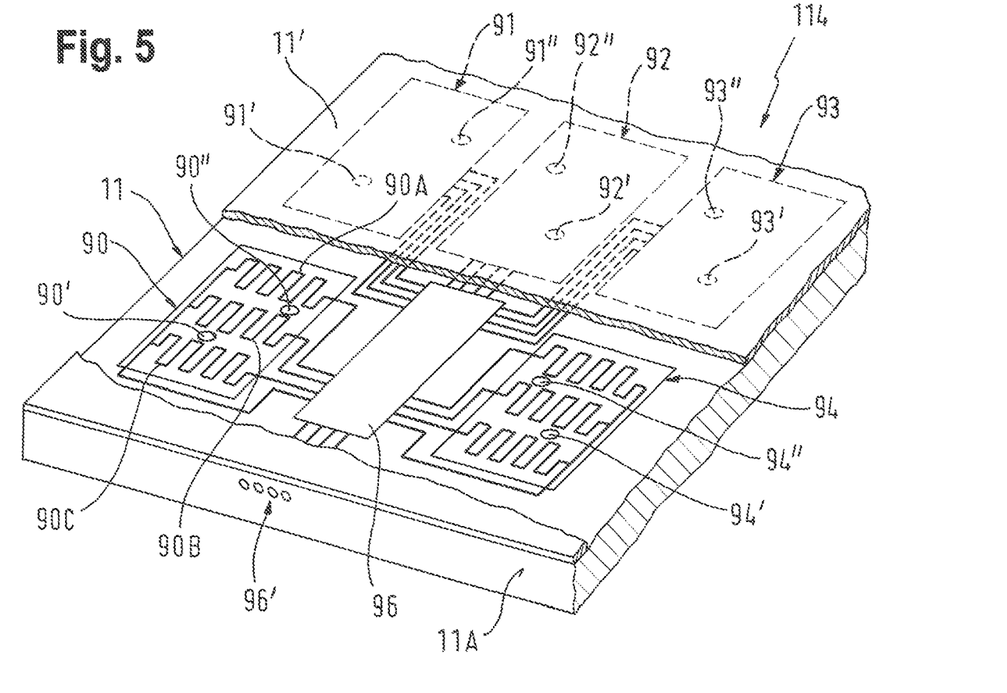
FIG. 5 is a perspective view of a base plate of a device carrier panel according to the invention, with electrical heating devices.

FIG. 5 shows a second, alternative embodiment of a base plate 11 of the device carrier panel 114, wherein the base plate 11 is provided with a plurality of electrical heating devices 90, 91, 92, 93, 94. The electrical heating devices 90, 91, 92, 93, 94 can be provided, as shown in FIG. 5, in the interior of the base plate 11, and covered by a cover layer 11' that has good heat conductivity and stands in a direct heat-transferring connection with the electrical heating devices 90, 91, 92, 93, 94. The electrical heating devices 90, 91, 92, 93, 94 can be formed by foil heating elements and can have at least one temperature sensor 90', 90", 91', 91", 92', 92", 93', 93", 94', 94", in each instance.

As shown in FIG. 5, each of the electrical heating devices 90, 91, 92, 93, 94 can have heating regions (for example 90A, 90B, 90C) that can be controlled separately from one another. Each heating region of each heating device 90, 91, 92, 93, 94 stands in an electrically conductive connection with a temperature control device 96 provided in, on the side or on top of the base plate 11, by way of a separate power supply line (shown with a broken line in FIG. 5). The respective temperature sensors 90', 90", 91', 91", 92', 92", 93', 93", 94', 94" provided in or on the base plate 11 are also connected, in electrically conductive manner, with the temperature control device 96, for signal transmission by way of a respective signal line (shown with a broken line in FIG. 5). The temperature control device 96 is therefore able to regulate the electrical energy that is supplied to each heating region of each heating device 90, 91, 92, 93, 94, taking into consideration the signals of the temperature sensors 90', 90", 91', 91", 92', 92", 93', 93", 94', 94". The temperature control device 96 is supplied with electrical energy, in the state of the device carrier panel 114 that has the base plate 11 when installed in the satellite, by way of electrical contacts 96' provided in the face side 11A of the base plate 11, and furthermore stands in a data exchange with an overriding thermal management control device of the satellite.

The electrical heating devices 90, 91, 92, 93, 94 are disposed so as to be distributed over the surface of the base plate 11 or at least over a region of the surface of the base plate 11, preferably in a uniform raster. In this way, it is possible to heat the base plate with different local intensity and with local temperature control.

Even though the embodiments of FIGS. 4 and 5 are shown separately in the figures, the embodiments of FIGS. 4 and 5 can be combined with one another as desired. Likewise, in this embodiment, as well, with electrical heating/cooling devices, at least one thermal contact plate 41 can be provided in the same manner as the one that was described in connection with the first embodiment.

Figure 6:
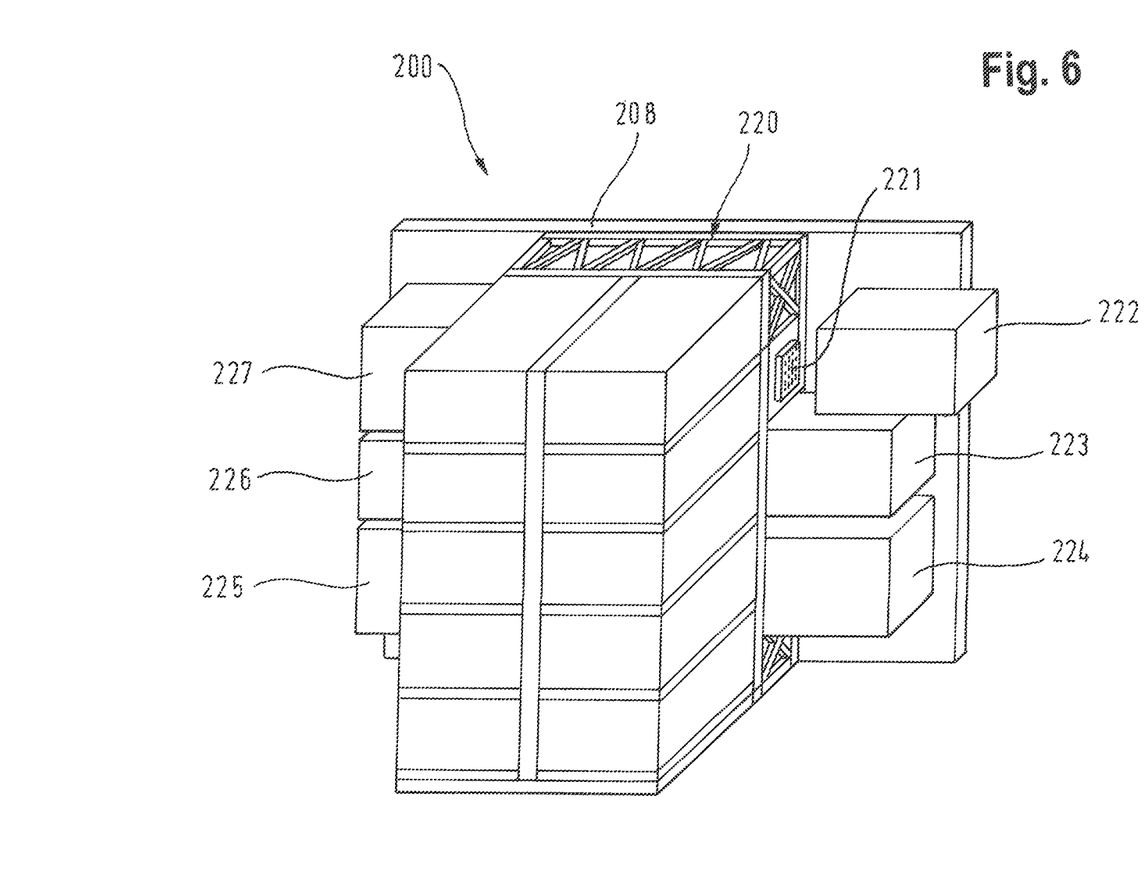
FIG. 6 is a modification of the satellite from FIG. 2 with an expanded basis.

FIG. 6 shows a modified embodiment of the satellite 200 according to the invention, in which the basis structural panel 208 projects laterally beyond the docking structure 220, and in which electrical connection devices 221 for connecting additional electronics boxes 222, 223, 224, 225, 226, 227 are also provided on these sides of the docking structure 220, on which the basis structural plate 208 projects beyond the docking structure 220. Corresponding mechanical connection elements (not shown) are affixed to the basis structural panel 208 in the same manner as has been described in connection with FIG. 3, with regard to the base plate 10. The basis structural panel 208, which faces Earth during operation of the satellite 200, in other words lies on the cooler shade side of the satellite, facing away from the sun, is configured to be highly heat-conductive and emits the heat absorbed by the electronics boxes into space over a large area.

Figure 7:
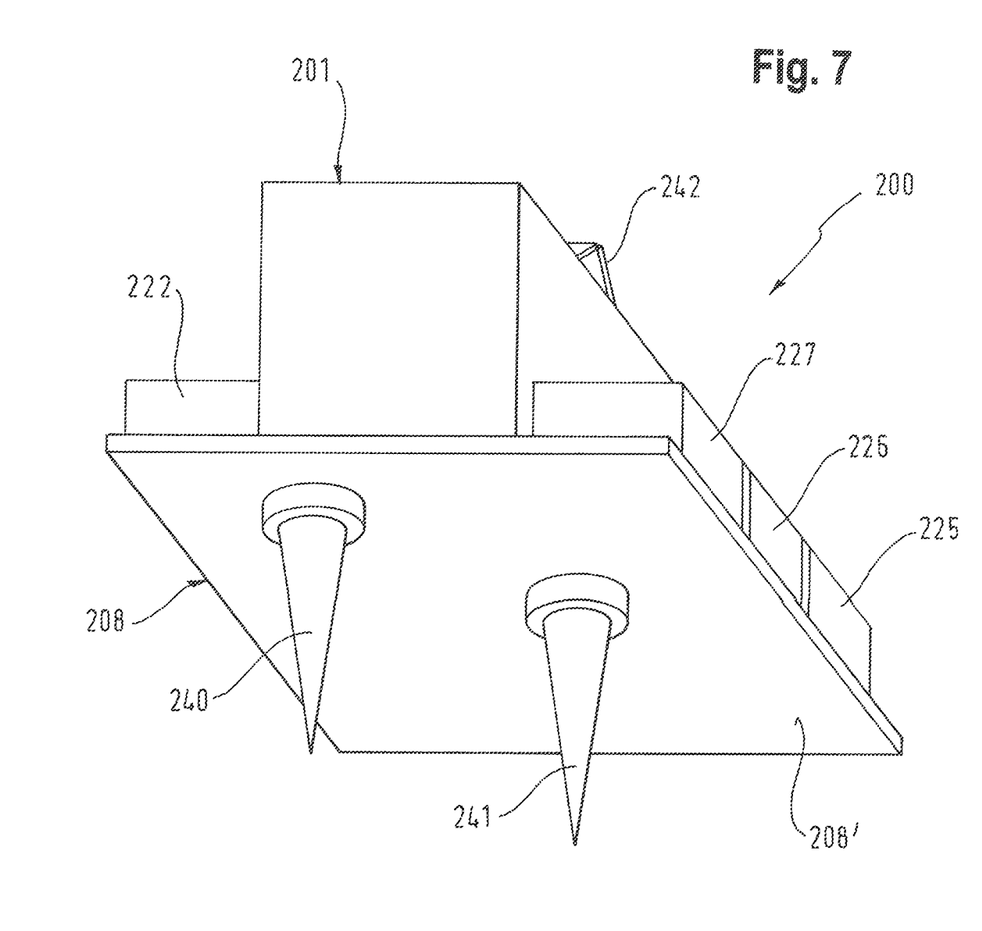
FIG. 7 is a rear view of the satellite from FIG. 6.

FIG. 7 shows the variant of FIG. 6 from the side of the basis structural panel 208 that faces Earth, with the corpus 201 covered, corresponding to the structure of the corpus 101 described in connection with FIGS. 1 and 2. The side wall panels 106, 107 of the corpus 101 can be provided with an elastic, heat-conductive film, such as that known under the trade name Sikaflex®, for example, on the inside, which film lies against the electronics boxes in the assembled state of the corpus 101 and conducts heat away from the electronics boxes to the respective side wall.

On the rear side 208' of the basis structural panel 208 that faces Earth, two conical antennas 240, 241 are shown schematically, by way of which antennas radio connections with the ground station can be maintained. In addition, a laser communication device 242 is represented on the corpus 201.

Figure 8:
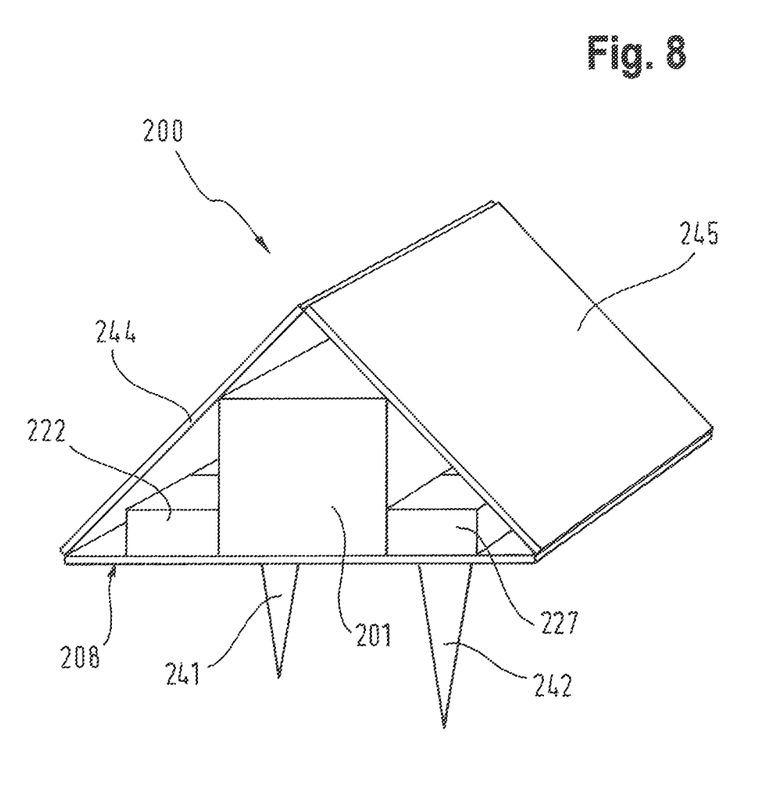
FIG. 8 a modification of the satellite from FIG. 7.

FIG. 8 shows the satellite from FIG. 7, wherein two plates 244, 245 are provided on the basis structural panel 208, which plates cover the outer electronics boxes 222, 223, 224, 225, 226, 227, and the corpus 201, in the manner of a roof. These roof-like plates 244, 245 can be covered with solar panels and supply the satellite 200 with electrical energy.

Reference symbols in the claims, the description, and the drawings serve merely for a better understanding of the invention and are not intended to restrict the scope of protection.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A modular satellite having a plurality of electronics boxes that accommodate at least one of electrical or electronic modules, wherein the electronics boxes are electrically connected or electrically connectable with one another, comprising:
   a basis structural panel,
   a docking structure disposed on the basis structural panel,
   a plurality of device carrier panels that are connected or connectable with the docking structure,
   wherein the docking structure has first electrical connection elements for an electrical connection with the electronics boxes,
   wherein the device carrier panels have mechanical connection elements for holding the electronics boxes, and
   wherein the respective device carrier panel is configured, at least in certain regions, so as to be temperable by means of at least one of integrated heat sources or heat sinks.

2. The modular satellite according to claim 1, wherein the mechanical connection elements of the device carrier panels and the electrical connection elements of the docking structure assigned to them, form docking stations for the electronics boxes, and at least part of the docking stations are configured in the same manner and arranged in a raster, in order to determine accommodation niches for the electronics boxes.

3. The modular satellite according to claim 1, wherein the docking structure is configured as a lattice-like box profile, in an interior of which electrical supply lines and connection lines run, which lines are connected with the electrical connection elements.

4. The modular satellite according to claim 1, wherein the at least one of heat sources or heat sinks integrated into the device carrier panel are provided in a base plate of the device carrier panel.

5. The modular satellite according to claim 4, wherein
   the base plate is provided with at least one heat contact surface in the region of the first mechanical connection elements, on which surface an electronics box that stands in engagement with the mechanical connection elements lies on a housing surface with heat-conductive contact, and
   the at least one heat contact surface stands in heat-conductive contact with the at least one of a heat source or heat sink integrated into the base plate.

6. The modular satellite according to claim 4, wherein the base plate is equipped, at least in certain regions, with heat conduction devices, which are configured for transporting away, by means of heat conduction, the heat or cold that acts on the base plate or on a region of the base plate.

7. The modular satellite according to claim 6, wherein the heat conduction devices have heat pipes that are provided on or in the base plate.

8. The modular satellite according to claim 7, wherein the heat pipes are formed by tracks of a heat-conductive material that run in the interior of the base plate.

9. The modular satellite according to claim 7, wherein the heat pipes are formed by channels of a heat-conductive material that run in the interior of the base plate, the channels being configured to contain a flow of a heat transport medium.

10. The modular satellite according to claim 6, wherein the base plate is provided with heat conduction coupling devices, which stand in a heat-conductive connection with the heat conduction devices, and which can be coupled, in heat-conductive manner, with other heat conduction devices outside of the base plate.

11. The modular satellite according to claim 4, wherein the base plate is equipped, at least in certain regions, with at least one of electrical cooling or heating devices that are configured for directly cooling or heating the base plate or a region of the base plate.

12. The modular satellite according to claim 6, wherein a plurality of at least one of individually controllable heat conduction devices, cooling or heating devices is provided, distributed over a surface of the base plate.

13. The modular satellite according to claim 12, wherein at least one temperature sensor is assigned to each of the individually controllable heat conduction devices, cooling or heating devices, in or on the base plate.

14. The modular satellite according to claim 13, wherein a temperature control device is provided, which is connected with the temperature sensors by way of signal lines and is connected with the individually controllable heat conduction devices, cooling or heating devices by way of control lines.

15. The modular satellite according to claim 14, wherein the temperature control device is provided on the base plate.

16. The modular satellite according to claim 14, wherein the temperature control device is integrated into the base plate.

17. A modular satellite having a plurality of electronics boxes that accommodate at least one of electrical or electronic modules, wherein the electronics boxes are electrically connected or electrically connectable with one another, comprising:
   a basis structural panel,
   a docking structure disposed on the basis structural panel,
   a plurality of device carrier panels that are connected or connectable with the docking structure,
   wherein the docking structure has first electrical connection elements for an electrical connection with the electronics boxes,
   wherein the device carrier panels have mechanical connection elements for holding the electronics boxes, and
   wherein the respective device carrier panel is configured, at least in certain regions, so as to be temperable by means of integrated heat sources and heat sinks.

18. The modular satellite according to claim 17, wherein the heat sources and heat sinks integrated into the device carrier panel are provided in a base plate of the device carrier panel.

19. The modular satellite according to claim 18, wherein the base plate is equipped, at least in certain regions, with electrical cooling and heating devices that are configured for directly cooling or heating the base plate or a region of the base plate.

* * * * *